(12) United States Patent
Okabe

(10) Patent No.: US 12,742,822 B2
(45) Date of Patent: Sep. 22, 2026

(54) STATE-OF-CHARGE ESTIMATION METHOD

(71) Applicant: HONDA MOTOR CO., LTD., Tokyo (JP)

(72) Inventor: Hiroto Okabe, Tokyo (JP)

(73) Assignee: HONDA MOTOR CO., LTD, Tokyo (JP)

( * ) Notice: Subject to any disclaimer, the term of this patent is extended or adjusted under 35 U.S.C. 154(b) by 390 days.

(21) Appl. No.: 18/495,768

(22) Filed: Oct. 27, 2023

(65) Prior Publication Data

US 2024/0142525 A1 May 2, 2024

(30) Foreign Application Priority Data

Oct. 31, 2022 (JP) ................................ 2022-174963

(51) Int. Cl.

*G01R 31/367* (2019.01)
*B60L 58/12* (2019.01)
*B60L 58/16* (2019.01)
*G01R 31/3835* (2019.01)
*G01R 31/392* (2019.01)

(52) U.S. Cl.

CPC ............ *G01R 31/367* (2019.01); *B60L 58/12* (2019.02); *B60L 58/16* (2019.02); *G01R 31/3835* (2019.01); *G01R 31/392* (2019.01)

(58) Field of Classification Search

CPC .............. G01R 31/367; G01R 31/3835; G01R 31/392; G01R 31/36; G01R 31/3828; G01R 31/387; G01R 31/396; B60L 58/12; B60L 58/16

See application file for complete search history.

(56) References Cited

U.S. PATENT DOCUMENTS

2009/0256524 A1* 10/2009 Nukui .................. G01R 31/382 320/132
2015/0377972 A1* 12/2015 Bussar .................. H01M 10/48 702/63

FOREIGN PATENT DOCUMENTS

CN 102470771 A * 5/2012 ............. B60L 58/19
JP 6973488 B2 12/2021

* cited by examiner

*Primary Examiner* — Tung S Lau
(74) *Attorney, Agent, or Firm* — CKC & PARTNERS CO., LLC

(57) ABSTRACT

Provided is a state-of-charge estimation method that includes: obtaining a plurality of pseudo-SOC values before depolarization, based on a cell voltage after a battery 11 is continuously charged or discharged and the charging or discharging is stopped; setting an initial value for an estimated SOC value that is estimated as a post-depolarization SOC; obtaining a Δ-pseudo-SOC value that is a difference between each of the pseudo-SOC values and the estimated SOC value; obtaining a correlation between a square of the Δ-pseudo-SOC value and a rate of change of the Δ-pseudo-SOC value; classifying the correlation into a first region in which there is non-linear change and a second region in which there is linear change, and obtaining a regression line for the second region; and using the regression line to correct the estimated SOC value such that the estimated SOC value approaches a post-depolarization true SOC value.

9 Claims, 12 Drawing Sheets

V
1
POWER STORAGE SYSTEM
12
SENSOR
121
VOLTAGE SENSOR
122
CURRENT SENSOR
10
CONTROL APPARATUS
11
BATTERY
112
COMMUNICATION UNIT
2
MANAGEMENT SERVER
21
STORAGE UNIT
22
CONTROL UNIT
23
COMMUNICATION UNIT
3
SMART DEVICE
31
OPERATION UNIT
32
DISPLAY UNIT
33
COMMUNICATION UNIT

LITHIUM-ION CONCENTRATION d(PSEUDO-SOC)/dt

PSEUDO-SOC

TRUE SOC (PSEUDO-SOC − TRUE SOC)

DISTANCE(x)

CURRENT COLLECTOR $i = 0 \sim n\text{-}1$ $$y = \frac{d\,\text{PSEUDO-SOC}}{dt} = \frac{\text{PSEUDO-SOC}[i] - \text{PSEUDO-SOC}[i+1]}{\Delta t}$$

$$x = (\text{PSEUDO-SOC} - \text{ESTIMATED SOC})^2 = \left(\frac{\text{PSEUDO-SOC}[i] + \text{PSEUDO-SOC}[i+1]}{2} - \text{ESTIMATED SOC}\right)^2$$

FIG. 20

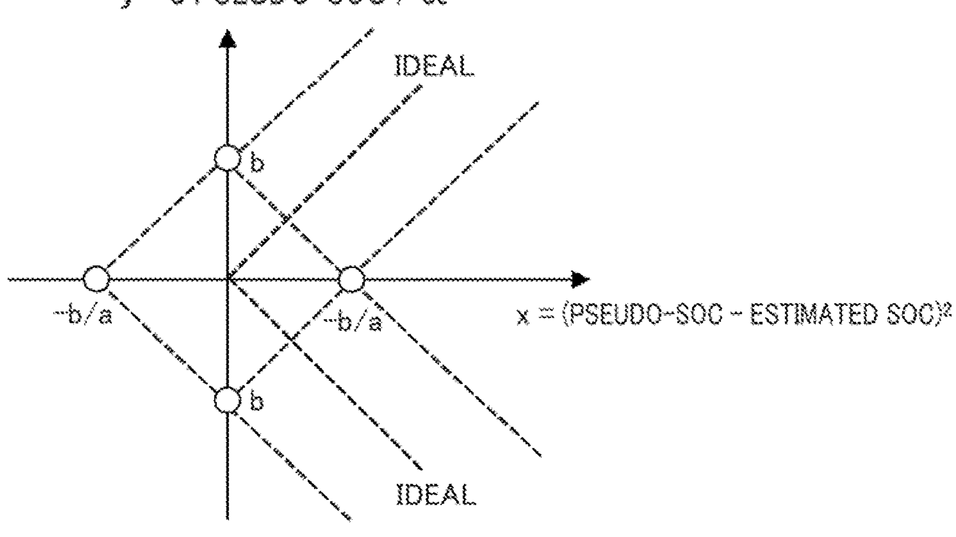

FIG. 21

| | a | b | -b/a | ERROR |
|---|---|---|---|---|
| DISCHARGING DEPOLARIZATION | POSITIVE AND NEGATIVE | > 0(POSITIVE) | POSITIVE AND NEGATIVE | $-\sqrt{}$ |
| | > 0(POSITIVE) | < 0(NEGATIVE) | > 0(POSITIVE) | $\sqrt{}$ |
| CHARGING DEPOLARIZATION | < 0(NEGATIVE) | > 0(POSITIVE) | > 0(POSITIVE) | $-\sqrt{}$ |
| | POSITIVE AND NEGATIVE | < 0(NEGATIVE) | POSITIVE AND NEGATIVE | $+\sqrt{}$ |

POSITIVE AND NEGATIVE FOR Δ AMOUNT OF POLARIZATION BECOME STRANGE, AND GRAPH CURVES

FOR THE INITIAL VALUE, ERROR IS INTENTIONALLY MADE TO BE THESE

POSITIVE AND NEGATIVE FOR Δ AMOUNT OF POLARIZATION BECOME STRANGE, AND GRAPH CURVES

STATE-OF-CHARGE ESTIMATION METHOD

This application is based on and claims the benefit of priority from Japanese Patent Application No. 2022-174963, filed on 31 Oct. 2022, the content of which is incorporated herein by reference.

BACKGROUND OF THE INVENTION

Field of the Invention

The present invention pertains to a state-of-charge estimation method.

Related Art

In recent years, research and development pertaining to secondary batteries that contribute to improving energy efficiency has been carried out in order to be able to ensure access to sustainable and advanced energy that is affordable and can be trusted by many people.

For a vehicle equipped with a secondary battery, a method is known for estimating a state of health (SOH) representing a deterioration state of the battery, by using an SOC-OCV curve to convert an open circuit voltage (OCV) at a time of activation to thereby calculate a state of charge of the battery, and dividing a change in capacity ΔAh by an amount of change ΔSOC for the calculated SOC. In addition, considering that a battery polarization phenomenon occurs, in which a difference between a battery voltage when a current is flowing and a battery voltage when the current is not flowing arises, inter alia, immediately after a shutdown, an OCV for when a sufficient amount of time has elapsed since a previous shutdown is used in order to resolve voltage error due to the polarization phenomenon.

For example, an SOH estimation technique disclosed in Patent Document 1 pays attention to only the amount of time for resolving the battery polarization phenomenon, and estimates SOH by correcting an amount of polarization from a charging or discharging current amount at a previous activation time. In the past as in the technique in Patent Document 1, it is often the case that control design, in which information regarding the relative length of an amount of depolarization time is used and whether to execute a computation is determined in consideration of a level of impact on SOH estimation.

CITATION LIST

Patent Document

Patent Document 1: Japanese Patent No. 6973488

SUMMARY OF THE INVENTION

However, various factors impact SOH estimation. In particular, polarization voltage is greatly impacted by a past history of inputs and outputs such as an amount of charging/discharging time or a charge/discharge current profile for a battery, and an impact on error variously changes in accordance with the situation. Accordingly, it is considering that a large amount of laboratory-level data must be obtained in advance in order to make a correction using the technique from Patent Document 1.

In addition, in conjunction with increased battery capacities in electric automobiles and the like, large polarization arises after discharge due to travel or after charging is stopped, and thus the amount of time until depolarization has lengthened at present. In particular, in a vehicle to which a system that frequently repeats inputs and outputs into a battery such as V2G or V2H is applied, there is a concern that it will not be possible to sufficiently ensure an amount of depolarization time, and sufficient SOH estimation accuracy will not be able to be achieved. Accordingly, there is demand for a technique capable of accurately estimating SOH even before depolarization, and thus a technique capable of accurately estimating SOC is desired.

The present invention is made in light of the matter described above, and an object of the present invention is to provide a technique that is capable of accurately estimating SOC even before depolarization of a battery. Consequently, another object of the present invention is to contribute to improving energy efficiency.

(1) A state-of-charge estimation method for estimating an SOC that is a state of charge of a battery, the method including: obtaining a plurality of pseudo-SOC values before depolarization of the battery, based on a voltage of the battery after the battery is continuously charged or discharged and the charging or discharging is stopped; setting an initial value for an estimated SOC value that is estimated as a post-depolarization SOC; obtaining a Δ-pseudo-SOC value that is a difference between each of the pseudo-SOC values and the estimated SOC value; obtaining a correlation between a square of the Δ-pseudo-SOC value obtained and a rate of change of the Δ-pseudo-SOC value; classifying the correlation obtained by the correlation obtainment step into a first region in which the rate of change of the Δ-pseudo-SOC value changes non-linearly with respect to the square of the Δ-pseudo-SOC value and a second region in which the rate of change of the Δ-pseudo-SOC value changes linearly with respect to the square of the Δ-pseudo-SOC value, and obtaining a regression line representing the rate of change of the Δ-pseudo-SOC value with respect to the square of the Δ-pseudo-SOC value when the rate of change of the Δ-pseudo-SOC value is in the second region; and using the regression line obtained to correct the estimated SOC value such that the estimated SOC value approaches a post-depolarization true SOC value.

By virtue of the invention according to (1), cell voltage data for after continuous charging or discharging with respect to the battery is complete is used to obtain a regression line representing the rate of change of a Δ-pseudo-SOC value with respect to the square of the Δ-pseudo-SOC value before depolarization, and thus the regression line is used to estimate post-depolarization SOC for the battery. Therefore, for example, it is possible to accurately estimate SOC even before depolarization of the battery immediately before shut down. Accordingly, in particular, regarding a vehicle to which usage such as V2G or V2H is applied, it is possible to ensure sufficient computation frequency and computation accuracy, and it is possible to improve the accuracy of estimating SOC for the battery. In addition, for example, it is possible to perform a calculation before the vehicle shuts down even in a case where the amount of depolarization time after continuous charging or discharging is long. Therefore, it is possible to increase the frequency of estimating SOC, and it is possible to promptly notify a user of the latest SOC.

(2) In the state-of-charge estimation method according to (1), it may be that the method further includes storing the first region and the second region in the correlation, in which, in obtaining the plurality of pseudo-SOC values, the pseudo-SOC values are not obtained within an amount of time corresponding to the first region that is stored in advance in storing the first region and the second region, and the pseudo-SOC values are only obtained within an amount of time corresponding to the second region that is stored in advance in storing the first region and the second region.

By virtue of the invention according to (2), it is possible to reduce the number of times voltage, current, and pseudo-SOC values are obtained, and it is possible to reduce a control load because pseudo-SOC values as well as voltage or current are not obtained in the first region in which there is non-linearity in the correlation between the rate of change of Δ-pseudo-SOC values and the square of Δ-pseudo-SOC values, and pseudo-SOC values as well as the voltage or current are only obtained in the second region in which there is linearity.

(3) In the state-of-charge estimation method according to (1) or (2), it may be that the battery is installed in a vehicle and, in using the regression line obtained to correct the estimated SOC value, the estimated SOC value is corrected and the estimated SOC value approaches a post-depolarization true SOC value before a controller installed in the vehicle shuts down.

By virtue of the invention according to (3), post-depolarization SOC is estimated before a shutdown sequence for the control apparatus installed in the vehicle, and thus it is possible to promptly obtain and ascertain the latest SOC in a state where charging or discharging has completed.

(4) In the state-of-charge estimation method according to any one of (1) to (3), it may be that, in obtaining the plurality of pseudo-SOC values before depolarization of the battery, obtaining of the pseudo-SOC values is limited to within a predetermined amount of time.

By virtue of the invention according to (4), obtaining pseudo-SOC values is limited to within a predetermined amount of time, and thus it is possible to promptly obtain and ascertain the latest SOC in a state where charging or discharging has completed, while avoiding delaying a shutdown process for a controller, for example.

(5) In the state-of-charge estimation method according to any one of (1) to (4), it may be that, in obtaining the plurality of pseudo-SOC values before depolarization of the battery, the voltage of the battery when a current flowing to the battery is less than a predetermined value after the battery is continuously charged or discharged and the charging or discharging is stopped is employed as an OCV, and the pseudo-SOC values are obtained from an SOC-OCV curve prepared in advance for the battery.

By virtue of the invention according to (5), it is possible to treat CCV after charging or discharging has stopped as OCV, and obtain, from an SOC-OCV curve, a pseudo-SOC value before depolarization, and the effects of the invention according to (1) to (4) are reliably achieved.

(6) In the state-of-charge estimation method according to any one of (1) to (5), it may be that the method further includes calculating a current battery capacity Ah by dividing, by an amount of change ΔSOC that is an amount by which the estimated SOC value, corrected in using the regression line obtained to correct the estimated SOC value, changed due to continuous discharging or charging, a total accumulated value for a current that flowed while the estimated SOC value changed, and calculating an SOH that is a degree of deterioration of the battery, by dividing the calculated current battery capacity Ah by an initial battery capacity Ah.

By virtue of the invention according to (6), it is possible to accurately calculate SOH in addition to SOC, before depolarization of the battery.

(7) In the state-of-charge estimation method according to (6), it may be that the method further includes externally transmitting the SOH calculated in calculating the current battery capacity Ah and calculating the SOH, before the controller shuts down.

By virtue of the invention according to (7), for example before the controller shuts down, it is possible to transmit an accurately calculated SOH to an external management server, a diagnosis instrument, or user infotainment such as a smart device, which is a smartphone or the like.

(8) In the state-of-charge estimation method according to any one of (1) to (7), it may be that, letting the rate of change of the Δ-pseudo-SOC value be a Y axis and the square of the Δ-pseudo-SOC value be an X axis, the regression line is obtained, in classifying the correlation obtained and obtaining the regression line, by calculating a gradient a and a Y-intercept b using a linear regression computation.

By virtue of the invention according (8), post-depolarization SOC is estimated by using a linear relationship between the rate of change of a Δ-pseudo-SOC value and the square of the Δ-pseudo-SOC value, and thus it is possible to estimate an accurate post-depolarization SOC in a short amount of time.

(9) In the state-of-charge estimation method according (8), it may be that the estimated SOC value approaches the post-depolarization true SOC value by repeatedly correcting the estimated SOC value a predetermined number of times such that the Y-intercept b for the regression line matches a 0 point, in using the regression line obtained to correct the estimated SOC value.

By virtue of the invention according to (9), it is possible to estimate a true SOC in a short amount of time because a regression line representing the rate of change of a Δ-pseudo-SOC value with respect to the square of the Δ-pseudo-SOC value before depolarization is corrected and is caused to undergo a translation such that a Y-intercept b of the regression line matches a 0 point, whereby the estimated SOC gradually approaches the true SOC.

By virtue of the present invention, it is possible to provide a technique that is capable of accurately estimating SOC even before depolarization of a battery.

BRIEF DESCRIPTION OF THE DRAWINGS

FIG. 20 is a view that illustrates regression lines; and

FIG. 21 is a view that illustrates a relationship between an amount of correction (error), and a gradient a and a Y-intercept b of a regression line.

DETAILED DESCRIPTION OF THE INVENTION

With reference to the drawings, description is given in detail regarding an embodiment of the present invention.

Figure 1:
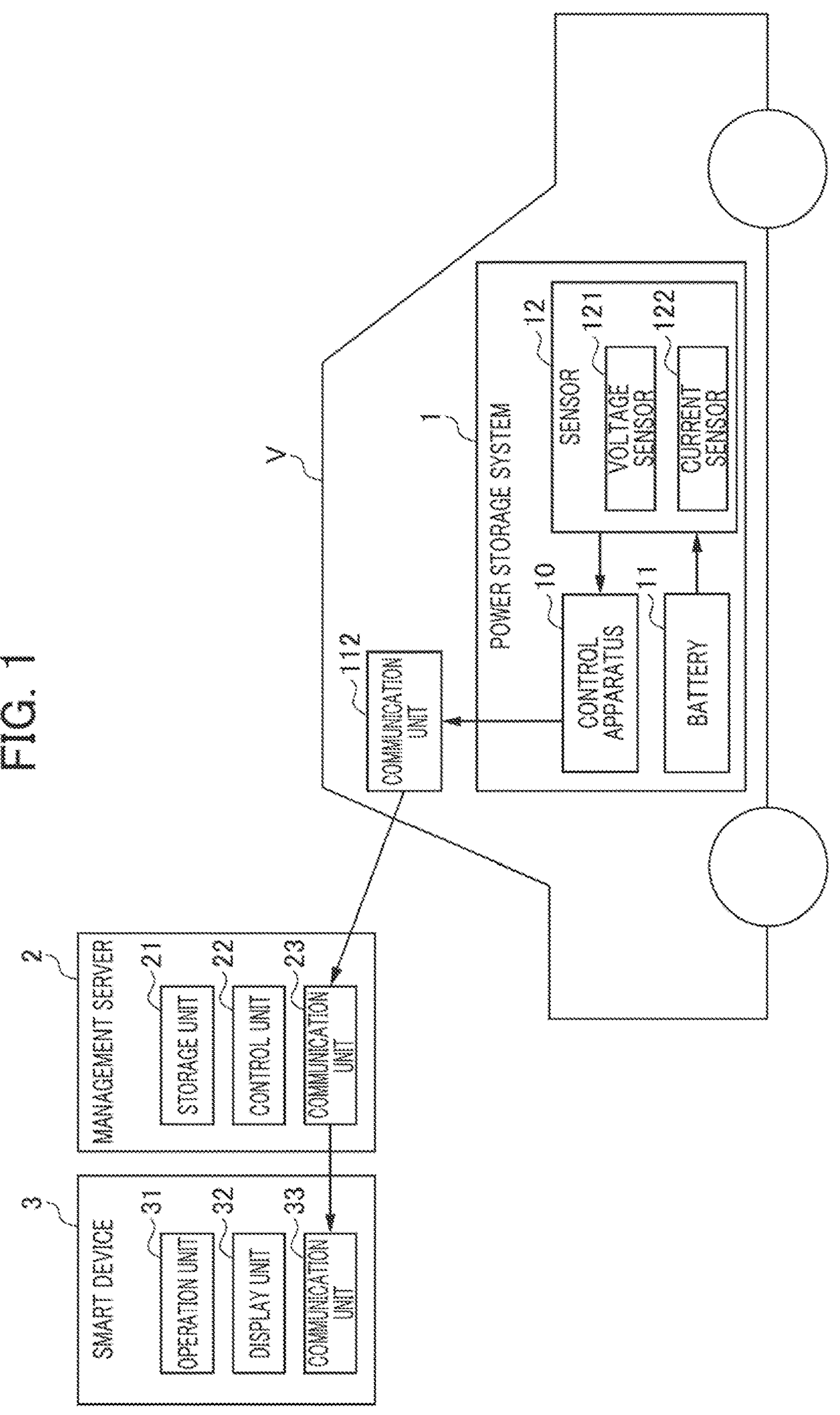
FIG. 1 is a view that illustrates a mobile body provided with a state-of-charge estimation apparatus according to one embodiment of the present invention.

FIG. 1 is a view that illustrates a mobile body provided with a state-of-charge estimation apparatus according to one embodiment of the present invention. The mobile body may be capable of moving in accordance with the supply of electric power from a battery, and may be various types of mobile bodies such as a ship or an aircraft, in addition to various types of vehicles, such as a two-wheeled vehicle, a three-wheeled vehicle, or a four-wheeled vehicle. In addition, the present embodiment is not limited to a mobile body, and can also be applied to various devices that are driven in accordance with the supply of electric power from a battery.

A vehicle V which corresponds to a mobile body and which is illustrated in FIG. 1 is an electric vehicle that travels in accordance with the supply of electric power from a battery. The vehicle V is a battery electric vehicle (BEV) provided with a motor that is driven in accordance with the supply of electric power from a battery, but may be a hybrid automobile HEV that is provided with an internal combustion engine and a motor that is driven in accordance with the supply of electric power from a battery.

As illustrated in FIG. 1, the vehicle V is provided with a power storage system 1 that has a control apparatus (ECU) 10, a battery 11, and a sensor 12.

For example, a lithium-ion secondary battery is used as the battery 11, but it is also possible to use, inter alia, an all-solid-state lithium secondary battery. The sensor 12 is provided with a voltage sensor 121 and a current sensor 122. The voltage sensor 121 detects a cell voltage for the battery 11, and a detected voltage value is transmitted to the control apparatus 10. The current sensor 122 detects a current flowing to the battery 11, and a detected current value is transmitted to the control apparatus 10.

The control apparatus 10 controls charging and discharging by the battery 11. For example, the control apparatus 10 controls charging with respect to the battery 11 from charging equipment (not illustrated) which corresponds to an external power supply. However, charging with respect to the battery 11 from the charging equipment may be controlled by a later-described management server 2 or a smart device 3. Note that it is possible to use a contactless power supply method in addition to a plug-in method for the charging equipment which corresponds to an external power supply.

The control apparatus 10 is configured by including a state-of-charge estimation apparatus that is according to the present embodiment and can estimate a state of charge (SOC) for the battery 11. It is possible to execute a state-of-charge estimation method according to the present invention by using this state-of-charge estimation apparatus. The state-of-charge estimation method which uses this state-of-charge estimation apparatus is described in detail at a later stage.

The control apparatus 10 in the vehicle V can use a communication unit 112 as illustrated in FIG. 1 to send and receive information in accordance with wireless communication to and from the external management server 2 and the smart device 3. Note that, for the convenience of the description, the communication unit 112 is illustrated separated from the control apparatus 10 in the power storage system 1 in FIG. 1, but the communication unit 112 may be provided in the control apparatus 10. The communication unit 112 is described in detail at a later stage.

The management server 2 is provided with a storage unit 21, a control unit 22, and a communication unit 23.

The communication unit 23 is capable of transmitting and receiving information using wireless communication to and from the control apparatus 10 in the vehicle V and the smart device 3. The communication unit 23 receives from the communication unit 112 various items of information pertaining to the vehicle V, for example, SOC information regarding the battery 11, or the like. In addition, the communication unit 23 receives, inter alia, a charging schedule or price plan information from, inter alia, an electric power company a user has a contract with.

The storage unit 21 stores, inter alia, various programs pertaining to controlling operation by the management server 2. The storage unit 21 also stores, inter alia, SOC information pertaining to the battery 11, a charging schedule, and price plan information that are received by the communication unit 23.

The control unit 22 controls operation by the management server 2. The control unit 22 reads out and executes various programs stored in the storage unit 21 to thereby execute charging with respect to the battery 11 from charging equipment which corresponds to an external power supply, for example.

The smart device 3 is provided with an operation unit 31, a display unit 32, and a communication unit 33. The smart device 3 is, inter alia, an information communication device used by a user of the vehicle V, and, for example, is user infotainment such as a smartphone, or a diagnosis instrument for the battery 11.

The communication unit 33 can transmit and receive information in accordance with wireless communication to and from the communication unit 23 in the management server 2 and the communication unit 112 in the vehicle V. The communication unit 33 receives various items of information pertaining to the vehicle V from the communication unit 112, for example SOC information regarding the battery 11 or the like, and also receives, inter alia, a charging schedule or price plan information from, inter alia, an electric power company that a user has a contract with.

The display unit 32 displays various items of information as an image. The display unit 32 performs a screen display for, inter alia, SOC information pertaining to the battery 11, a charging schedule, and price plan information that are received by the communication unit 33.

The operation unit 31 is, inter alia, a touch panel that accepts input of an operation by a user. When an operation by a user is inputted to the operation unit 31, inter alia, charging of the battery 11 is executed via the management server 2.

Next, the state-of-charge estimation method using a state-of-charge estimation apparatus according to the present embodiment is described in detail.

Figure 2:
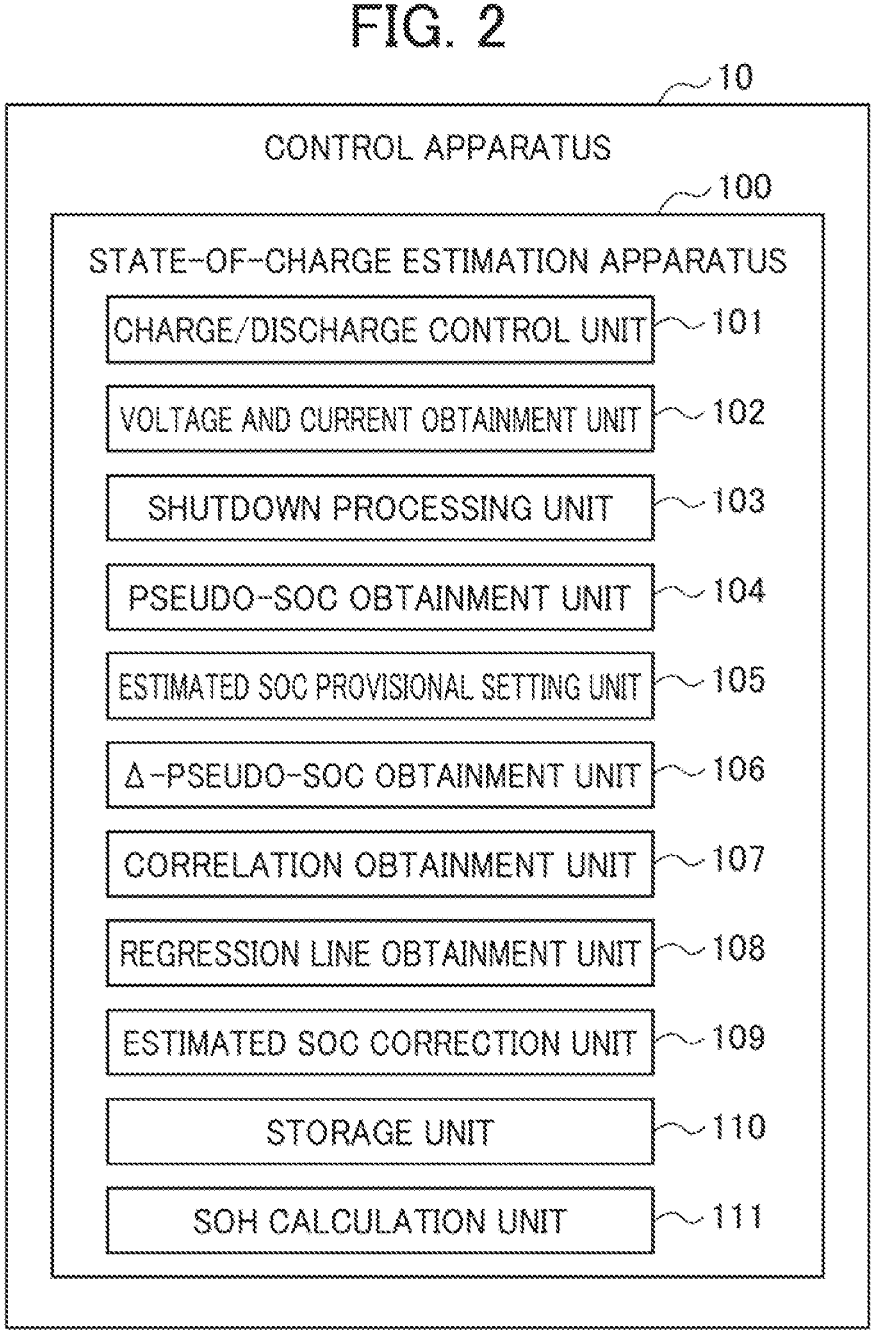
FIG. 2 is a view that illustrates a configuration of the state-of-charge estimation apparatus according to one embodiment of the present invention.

FIG. 2 is a view that illustrates a configuration of a state-of-charge estimation apparatus 100 according to the present embodiment. As described above, the state-of-charge estimation apparatus 100 according to the present embodiment is provided in the control apparatus 10 in the power storage system 1. As described above, in the estimation of SOC and SOH for a battery, an error arises due to a polarization voltage after charging or discharging. The state-of-charge estimation method using the state-of-charge estimation apparatus 100 according to the present embodiment corrects this error, and is capable of more accurately estimating SOC and SOH.

Figure 3:
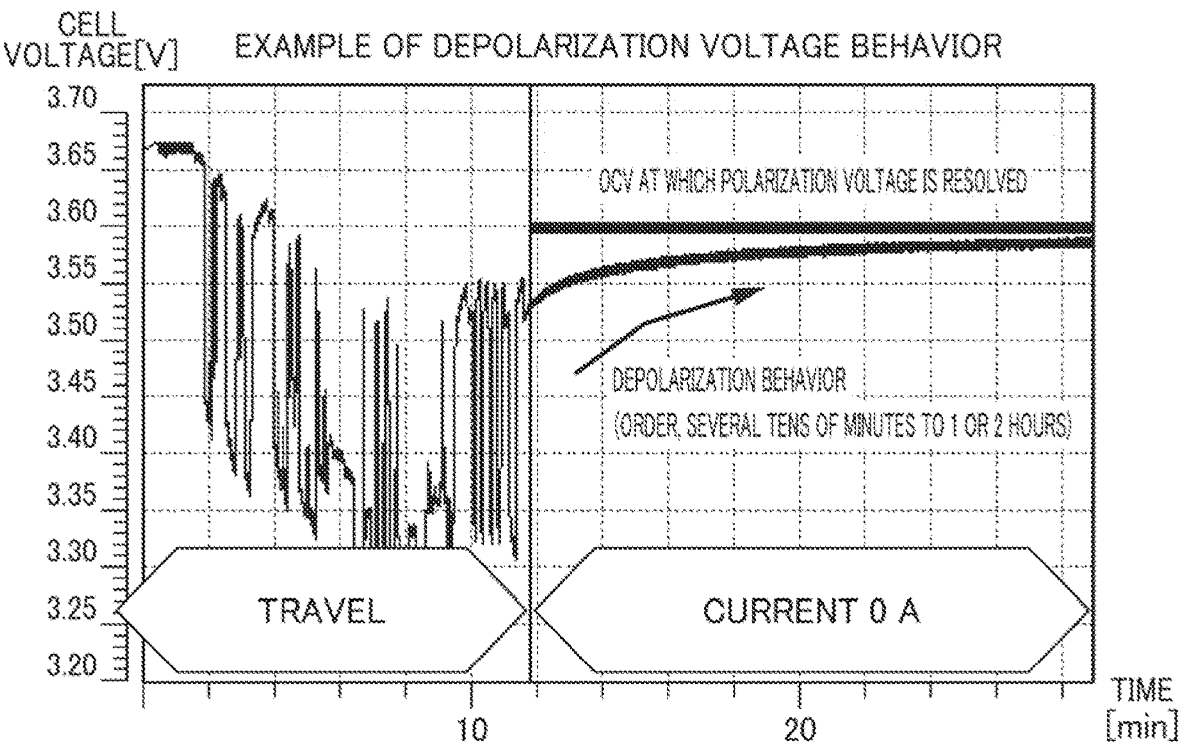
FIG. 3 is a view that illustrates an example of voltage behavior at a time of depolarization of a lithium-ion secondary battery.

Description in detail is given here regarding a battery polarization phenomenon. FIG. 3 is a view that illustrates an example of voltage behavior at a time of depolarization of a lithium-ion secondary battery. As illustrated in FIG. 3, a discharge current is supplied to the battery while the vehicle is traveling, and a cell voltage CCV for the battery is fluctuating. In contrast to this, when the vehicle stops traveling whereby the current ceases to be supplied to the battery, the polarization phenomenon occurs in which a difference arises between the cell voltage when the current is flowing and the cell voltage when the current is not flowing, as described above. This polarization phenomenon is considered to be caused by a polarization voltage that arises due to a temporary deviation in lithium-ion concentration in the battery. Accordingly, after continuous charging or discharging, a considerable amount of time is required until the deviation in lithium-ion concentration is resolved and the lithium-ion concentration becomes uniform, whereby the polarization voltage is resolved. Specifically, as illustrated in FIG. 3, an amount of time on the order of tens of minutes to 1 or 2 hours is required until the polarization voltage is gradually resolved and a constant OCV is achieved.

The polarization voltage of the battery is greatly impacted by a past history of inputs and outputs with respect to the battery, and the amount of time until the polarization phenomenon is resolved is impacted by various factors such as a charge/discharge current profile for the battery or an amount of charging/discharging time. Accordingly, accurately obtaining an amount of depolarization time has not been possible in the past. In addition, in conjunction with increased battery capacities in battery electric vehicles (BEV) and the like, large polarization arises after discharge due to travel or after charging is stopped, and thus the amount of time until depolarization has lengthened at present. In particular, in a vehicle to which a system that frequently repeats inputs and outputs into a battery such as V2G or V2H is applied, there is a concern that it will not be possible to sufficiently ensure an amount of depolarization time, and sufficient SOH estimation accuracy cannot be achieved. Accordingly, a technique is required that can accurately estimate SOH even before depolarization. Therefore, a technique that can accurately estimate SOC is desired, and the state-of-charge estimation method using the state-of-charge estimation apparatus 100 according to the present embodiment solves this.

Returning to FIG. 2, after continuous charging or discharging with respect to the battery 11 completes, the state-of-charge estimation apparatus 100 according to the present embodiment uses cell voltage data for a few seconds immediately before executing a shutdown process for the control apparatus 10 in which the state-of-charge estimation apparatus 100 is provided to estimate depolarization behavior after the battery 11 is charged or discharged, and thereby estimates post-depolarization SOC for the battery 11. An initial estimation is performed in a state where the estimated post-depolarization SOC (referred to as "estimated SOC"; the same applies hereinafter) includes error with respect to post-depolarization true SOC (referred to as "true SOC"; the same applies hereinafter). When the error disappears due to repeating computations, the estimated SOC matches the post-depolarization true SOC. As a result, it is possible to accurately estimate SOC even before depolarization of the battery 11.

Specifically, the state-of-charge estimation apparatus 100 first obtains a cell terminal voltage CCV for the battery 11 in an amount of time in a certain interval that is before entering a shutdown sequence for the control apparatus 10, after the current flowing to the battery 11 has decreased to less than a predetermined value, and post-depolarization of the battery 11 has started. Next, the obtained voltage value CCV is set as OCV, and an SOC-OCV curve is used to perform a conversion to SOC. Normally, when using an SOC-OCV curve to produce SOC from OCV, CCV is substituted in place of OCV to thereby obtain SOC (SOC obtained in this manner is referred to as a "pseudo-SOC"; the same applies hereinafter). When the rate of change of a pseudo-SOC value (d(pseudo-SOC)/dt) is set to a Y axis and a squared difference between the pseudo-SOC value and an estimated SOC value ($(\text{pseudo-SOC}—\text{estimated SOC})^2$) is set to an X axis, a linear relationship is achieved ($Y=aX+b$) and employed to calculate a regression line. The estimated SOC value is corrected based on the calculated regression line, whereby a more accurate SOC is estimated.

As illustrated in FIG. 2, the state-of-charge estimation apparatus 100 according to the present embodiment is provided with, as functional units for estimating an accurate SOC as described above, a charge/discharge control unit 101, a voltage and current obtainment unit 102, a shutdown processing unit 103, a pseudo-SOC obtainment unit 104, an estimated SOC provisional setting unit 105, a Δ-pseudo-SOC obtainment unit 106, a correlation obtainment unit 107, a regression line obtainment unit 108, an estimated SOC correction unit 109, a storage unit 110, an SOH calculation unit 111, and the communication unit 112.

The charge/discharge control unit 101 controls charging and discharging for the battery 11. The charge/discharge control unit 101 controls charging and discharging for the battery 11 in response to, inter alia, a driving operation by a user with respect to the vehicle V or a control signal transmitted from, inter alia, the management server 2 or the smart device 3 described above.

The voltage and current obtainment unit 102 obtains a cell voltage value for the battery 11, and a value for a current that flows from the battery 11. The cell voltage value is obtained based on a detection signal from the voltage sensor 121 described above, and the current value is obtained based on a detection signal from the current sensor 122 described above. The obtained cell voltage value and current value are used to estimate SOC by the state-of-charge estimation apparatus 100.

The shutdown processing unit 103 is for performing a shutdown process for the control apparatus 10 in which the state-of-charge estimation apparatus 100 is provided. The shutdown process is executed in response to, inter alia, an operation by the user for stopping the vehicle V.

The pseudo-SOC obtainment unit 104 executes a pseudo-SOC obtainment process in a pseudo-SOC obtainment step. Specifically, the pseudo-SOC obtainment unit 104 obtains n (n is a natural number greater than or equal to 2) pseudo-SOCs before depolarization of the battery 11, based on the voltage of the battery 11 after charging or discharging is stopped following continuous charging or discharging of the battery 11. The obtained pseudo-SOCs are saved in an array, in accordance with obtainment order. Here, pseudo-SOC is defined as an SOC obtained based on a CCV value that is a cell voltage immediately after charging or discharging of the battery 11. More specifically, presuming that current flowing to the battery 11 is less than a predetermined value, a pseudo-SOC is an SOC that is from before depolarization and is obtained by employing CCV, which is the cell voltage immediately after charging or discharging of the battery 11, as OCV, and using the SOC-OCV curve to perform a conversion. Note that the predetermined value is set, by experiment in advance or the like, to a value at which it is possible to determine that the current value is sufficiently low and a state of depolarization being underway has been entered.

Figure 4:
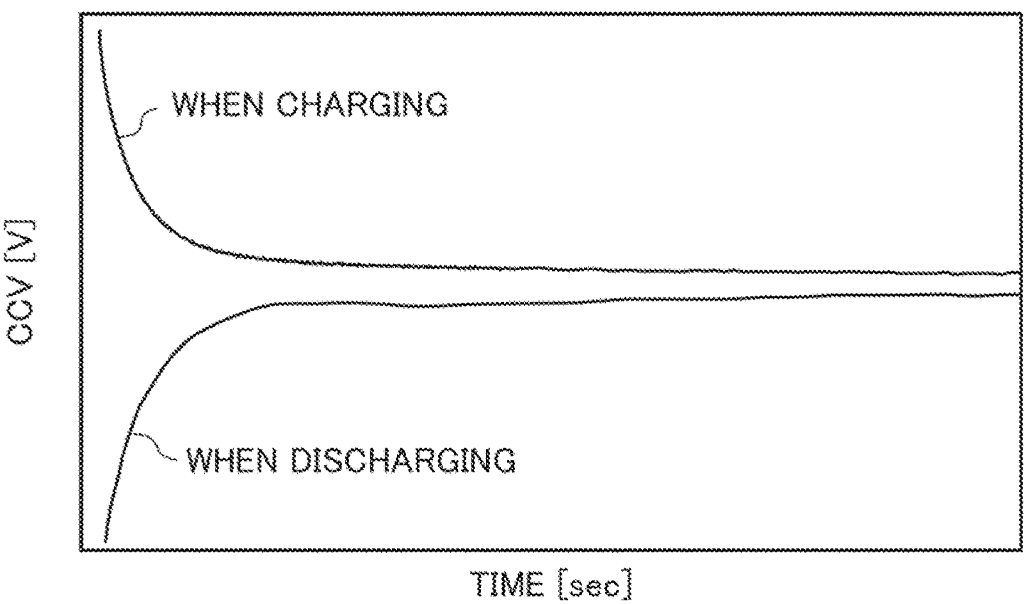
FIG. 4 is a view that illustrates charge in CCV during depolarization at a time of charging and a time of discharging.

Here, FIG. 4 is a view that illustrates change in CCV during depolarization at a time of charging and a time of discharging. As indicated in FIG. 3 described above, the voltage rises when discharging stops after continuous discharging due to vehicular travel. In contrast, the voltage drops when charging stops after continuous charging. In this manner, voltage behavior when charging or discharging is stopped differs between a time of charging or a time of discharging, and curves that are mutually inverted in the Y axis direction are achieved.

Figure 5:
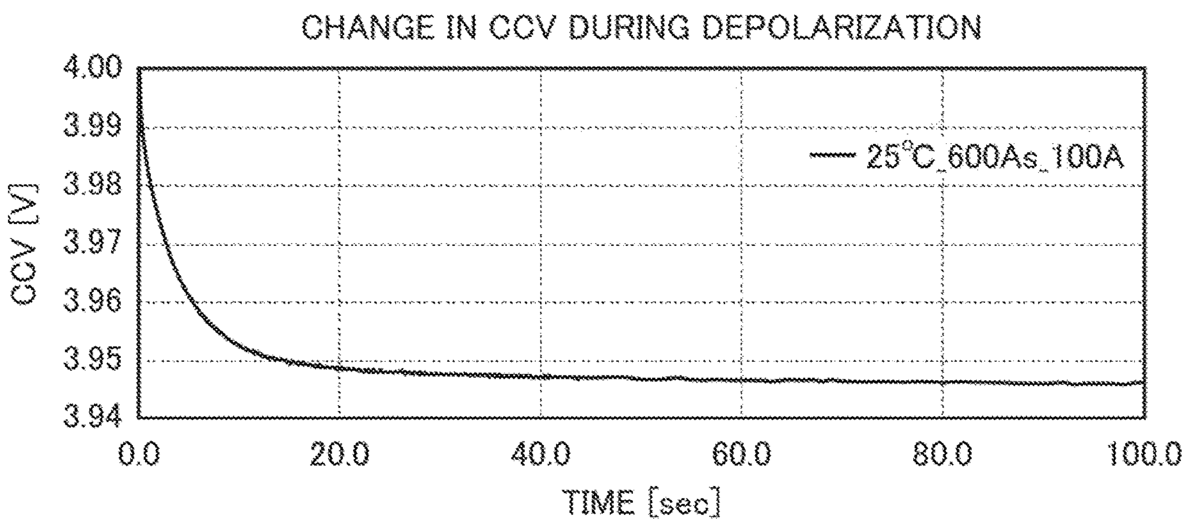
FIG. 5 is a view that illustrates an example of change in CCV during depolarization at a time of charging.

Here, FIG. 5 is a view that illustrates change in CCV during depolarization at a time of charging. FIG. 5 illustrates an example of change in CCV after the battery 11 is continuously charged and the charging is stopped. Note that, later-described FIG. 7 through FIG. 12 and FIG. 14 through FIG. 18 are all similar to FIG. 5 in illustrating examples for when the battery 11 is charged. As illustrated in FIG. 5, immediately after charging of the battery 11 is stopped, CCV becomes large due to the impact of the polarization voltage, but the polarization voltage is resolved with the passage of time and thus CCV gradually decreases and becomes constant.

Figure 6:
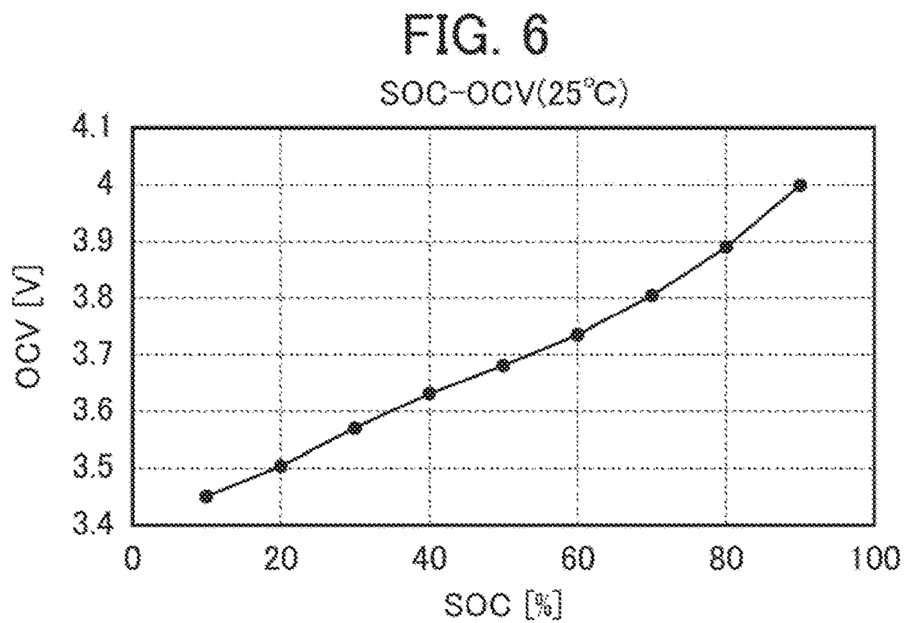
FIG. 6 is a view that illustrates an SOC-OCV curve.

FIG. 6 is a view that illustrates an SOC-OCV curve. This SOC-OCV curve is obtained in advance in accordance with the battery 11 and, for example, is stored in the storage unit 110, which is described below. The pseudo-SOC obtainment unit 104 sets CCV which is the cell voltage after charging or discharging of the battery 11 to OCV, and obtains a pseudo-SOC from this SOC-OCV curve.

Figure 7:
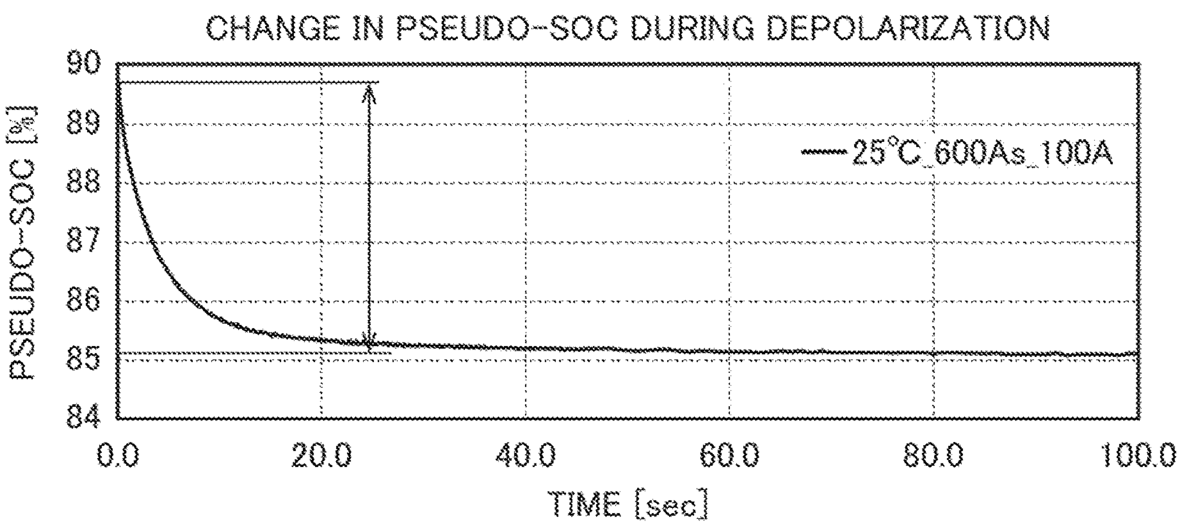
FIG. 7 is a view that illustrates change in pseudo-SOC during depolarization.

FIG. 7 is a view that illustrates change in pseudo-SOC during depolarization. FIG. 7 illustrates an example of change in the pseudo-SOC obtained by the pseudo-SOC obtainment unit 104 as described above. As illustrated in FIG. 7, the pseudo-SOC becomes a large value immediately after charging due to the impact of the polarization voltage, but the polarization voltage is resolved with the passage of time, and thus the pseudo-SOC gradually decreases and becomes constant. Having become constant, the pseudo-SOC is the post-depolarization true SOC.

Returning to FIG. 2, the estimated SOC provisional setting unit 105 executes an estimated SOC provisional setting process in an estimated SOC provisional setting step. Specifically, the estimated SOC provisional setting unit 105 sets an initial value for an estimated SOC value which is estimated as the post-depolarization SOC. By a later-described estimated SOC correction step, this estimated SOC value approaches the post-depolarization true SOC value.

The Δ-pseudo-SOC obtainment unit 106 executes a Δ-pseudo-SOC obtainment process in a Δ-pseudo-SOC obtainment step. Specifically, the Δ-pseudo-SOC obtainment unit 106 obtains Δ-pseudo-SOC values, which are respective differences between the pseudo-SOC values and the above-described estimated SOC value. During computation, the Δ-pseudo-SOC values are respective differences between the pseudo-SOC values and the estimated SOC value described above, but the estimated SOC value becomes the true SOC value after computation, and thus the Δ-pseudo-SOC values can be said to be respective differences between the pseudo-SOC values and the true SOC value.

Figure 8:
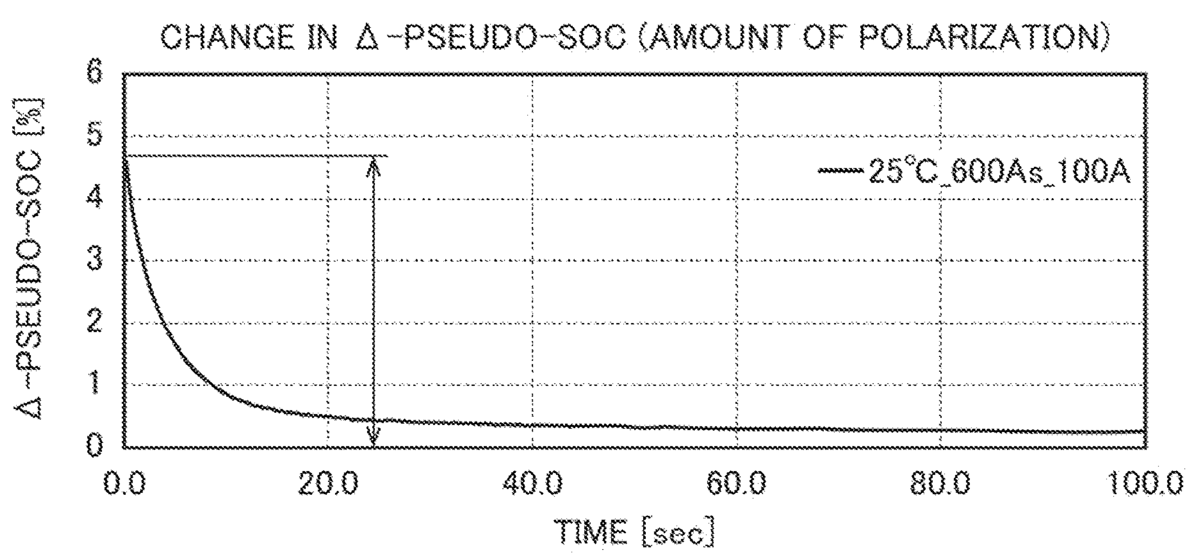
FIG. 8 is a view that illustrates change in a Δ-pseudo-SOC value.

FIG. 8 is a view that illustrates change in the Δ-pseudo-SOC value. This Δ-pseudo-SOC value represents an amount of polarization for the battery 11 and becomes a large value immediately after charging of the battery 11 as illustrated in FIG. 8, but the polarization voltage is resolved together with the passage of time, and thus the Δ-pseudo-SOC value gradually decreases and becomes constant.

Note that the arrows in FIG. 7 illustrates the initial difference between the pseudo-SOC value and the true SOC value (the estimated SOC value after computation and for which time has sufficiently elapsed), and the Δ-pseudo-SOC value, which is the difference at this point, is illustrated by arrows in FIG. 8. In other words, in FIG. 8, the Δ-pseudo-SOC value not converging to 0 means that polarization is not resolved in an amount of time that is approximately 100 seconds.

A voltage value obtained by the voltage and current obtainment unit 102 based on a detection signal from the voltage sensor 121 is a difference in potential over cell terminals belonging to the battery 11. Accordingly, in a case where current flowing to the battery 11 is 0 A, the voltage value obtained by the voltage and current obtainment unit 102 is considered to represent lithium-ion concentration near the cell terminals. In addition, Δ-pseudo-SOC, which is the amount of fluctuation of pseudo-SOC, is considered to indirectly represent an amount of fluctuation in lithium-ion concentration.

The pseudo-SOC obtainment unit 104 does not obtain a pseudo-SOC value within an amount of time corresponding to a first region which is stored in advance by the storage unit 110 which is described below. In contrast, the pseudo-SOC obtainment unit 104 obtains a pseudo-SOC value only within an amount of time corresponding to a second region which is stored in advance by the storage unit 110. The second region is where, as described below, a correlation of linearity is found between a Δ-pseudo-SOC rate of change and the square of Δ-pseudo-SOC, and thus a pseudo-SOC value is obtained only in this region. An amount of time corresponding to the second region is 1.4 seconds after charging is stopped in an example described below.

In addition, the pseudo-SOC obtainment unit 104 is limited to obtaining a pseudo-SOC value within a predetermined amount of time. For example, the pseudo-SOC obtainment unit 104 is limited to obtaining a pseudo-SOC value within a predetermined amount of time inside the second region, for which the correlation of linearity is found between the Δ-pseudo-SOC rate of change and the square of Δ-pseudo-SOC. In an example described below, the pseudo-SOC value is obtained for 3 seconds from 1.4 seconds after charging stops.

Returning to FIG. 2, the correlation obtainment unit 107 executes a correlation obtainment process in a correlation obtainment step. Specifically, the correlation obtainment unit 107 obtains a correlation between the rate of change of Δ-pseudo-SOC and the square of a Δ-pseudo-SOC value, which is the difference between the pseudo-SOC value obtained by the pseudo-SOC obtainment unit 104 and the estimated SOC value.

Figure 9:
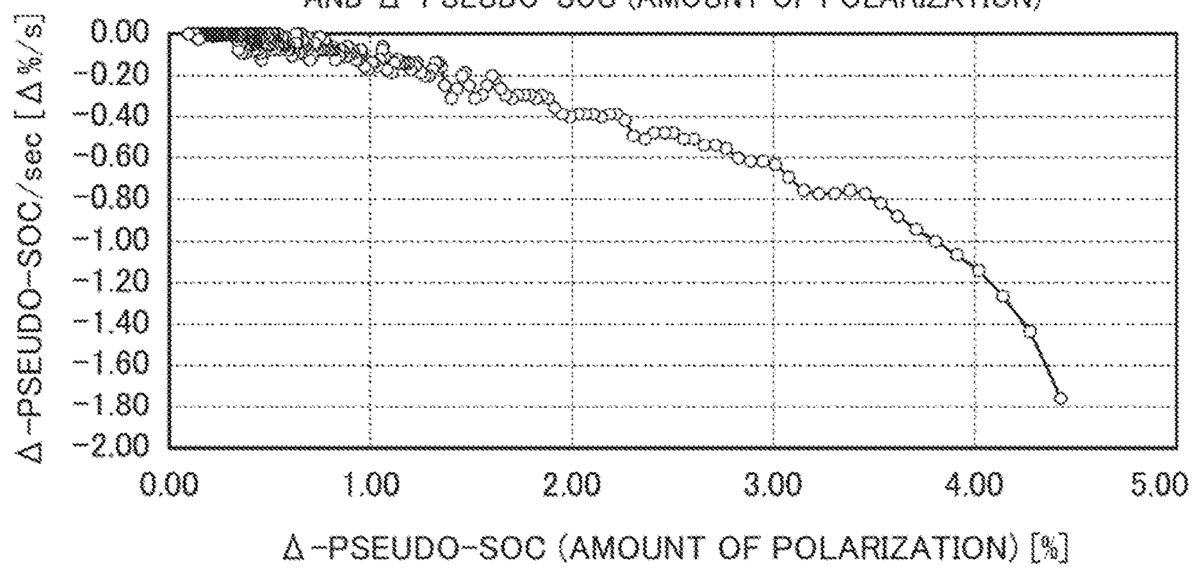
FIG. 9 is a view that illustrates a correlation between a Δ-pseudo-SOC rate of change and Δ-pseudo-SOC.

Here, FIG. 9 is a view that illustrates a correlation between a Δ-pseudo-SOC rate of change and Δ-pseudo-SOC. In FIG. 9, the horizontal axis is Δ-pseudo-SOC—in other words an amount of polarization, and the vertical axis is a Δ-pseudo-SOC rate of change. As illustrated in FIG. 9, it is understood that a correlation of linearity is not found between the Δ-pseudo-SOC rate of change and the Δ-pseudo-SOC.

Figure 10:
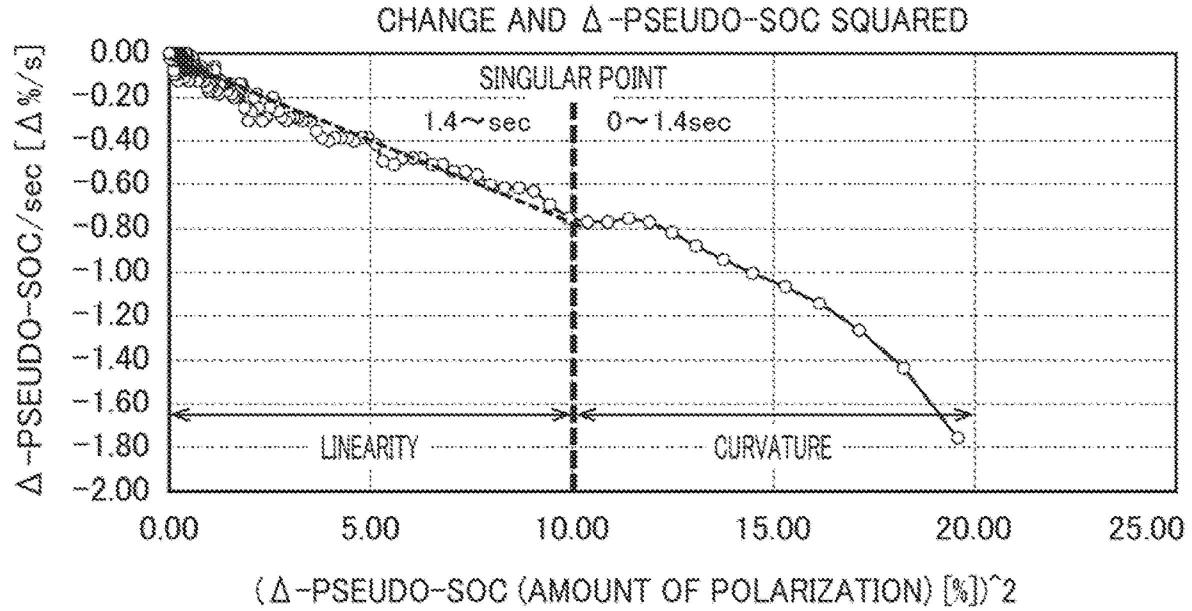
FIG. 10 is a view that illustrates a correlation between Δ-pseudo-SOC rate of change and the square of Δ-pseudo-SOC.

In contrast to this, FIG. 10 is a view that illustrates a correlation between Δ-pseudo-SOC rate of change and the square of Δ-pseudo-SOC. In FIG. 10, the horizontal axis is the square of the Δ-pseudo-SOC value—in other words the square of the amount of polarization, and the vertical axis is the rate of change of the Δ-pseudo-SOC value. As illustrated in FIG. 9, it is understood that a correlation of linearity is found between the Δ-pseudo-SOC rate of change and the square of Δ-pseudo-SOC.

In more details, the value of the square of the Δ-pseudo-SOC value being 10 forms a singular point, as illustrated in FIG. 10. In the region where the value of the square of the Δ-pseudo-SOC value is 0 to 10, a correlation of linearity is found between the Δ-pseudo-SOC rate of change and the square of Δ-pseudo-SOC. In contrast, in the region where the value of the square of the Δ-pseudo-SOC value exceeds 10, a correlation of linearity is not found between the Δ-pseudo-SOC rate of change and the square of Δ-pseudo-SOC.

Returning to FIG. 2, the regression line obtainment unit 108 executes a regression line obtainment process in a regression line obtainment step. Specifically, the regression line obtainment unit 108 classifies the correlation obtained by the correlation obtainment unit 107 into a first region in which the Δ-pseudo-SOC rate of change changes non-linearly with respect to the square of Δ-pseudo-SOC, and a second region in which the Δ-pseudo-SOC rate of change changes linearly with respect to the square of Δ-pseudo-SOC. In other words, in the example illustrated in FIG. 10, the regression line obtainment unit 108 classifies, as the second region, the region in which value of the square of Δ-pseudo-SOC is 0 to 10 and in which a correlation of linearity is found between the Δ-pseudo-SOC rate of change and the square of Δ-pseudo-SOC. In addition, the regression line obtainment unit 108 classifies, as the first region, the region in which value of the square of Δ-pseudo-SOC exceeds 10 and in which a correlation of linearity is not found between the Δ-pseudo-SOC rate of change and the square of Δ-pseudo-SOC.

The singular point in FIG. 10, converted to an amount of time, corresponds to 1.4 seconds after charging the battery 11. Accordingly, the second region, for which linearity is found and in which the value of the square of Δ-pseudo-SOC is 0 to 10 corresponds to 1.4 seconds after charging of the battery 11 stops. In addition, the first region, for which linearity is not found, curvature is found, and in which the value of the square of Δ-pseudo-SOC exceeds 10 corresponds to within 0 to 1.4 seconds once charging of the battery 11 stops.

In addition, the regression line obtainment unit 108 obtains a regression line that represents Δ-pseudo-SOC rate of change with respect to the square of Δ-pseudo-SOC for when the Δ-pseudo-SOC rate of change is in the second region. Specifically, the regression line obtainment unit 108 sets the Δ-pseudo-SOC rate of change as a Y axis, sets the square of Δ-pseudo-SOC to an X axis, and uses a linear regression computation such as least squares, for example, to calculate a gradient a and a Y-intercept b to thereby obtain a regression line. The linear regression computation is described in detail at a later state.

Figure 11:
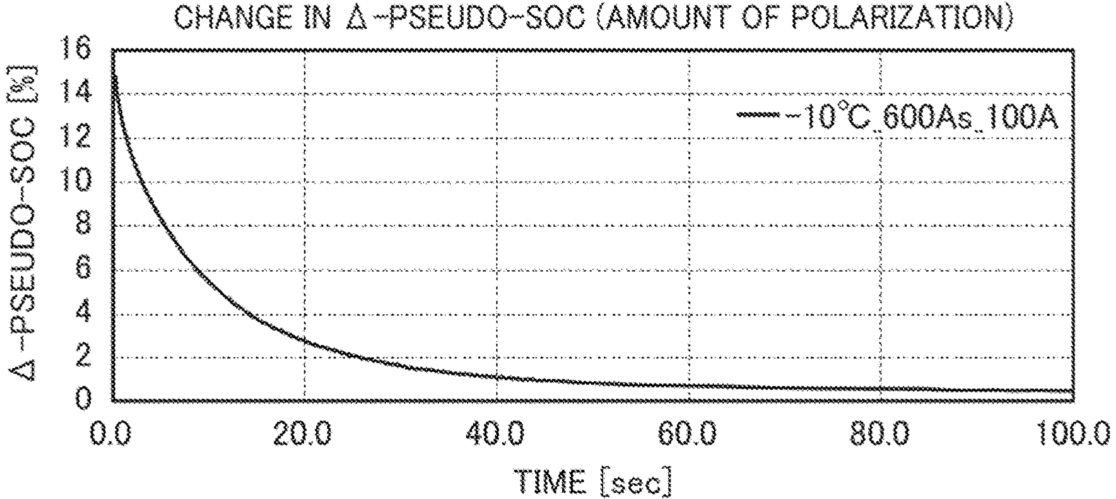
FIG. 11 is a view that illustrates change in Δ-pseudo-SOC at a low temperature.
Figure 12:
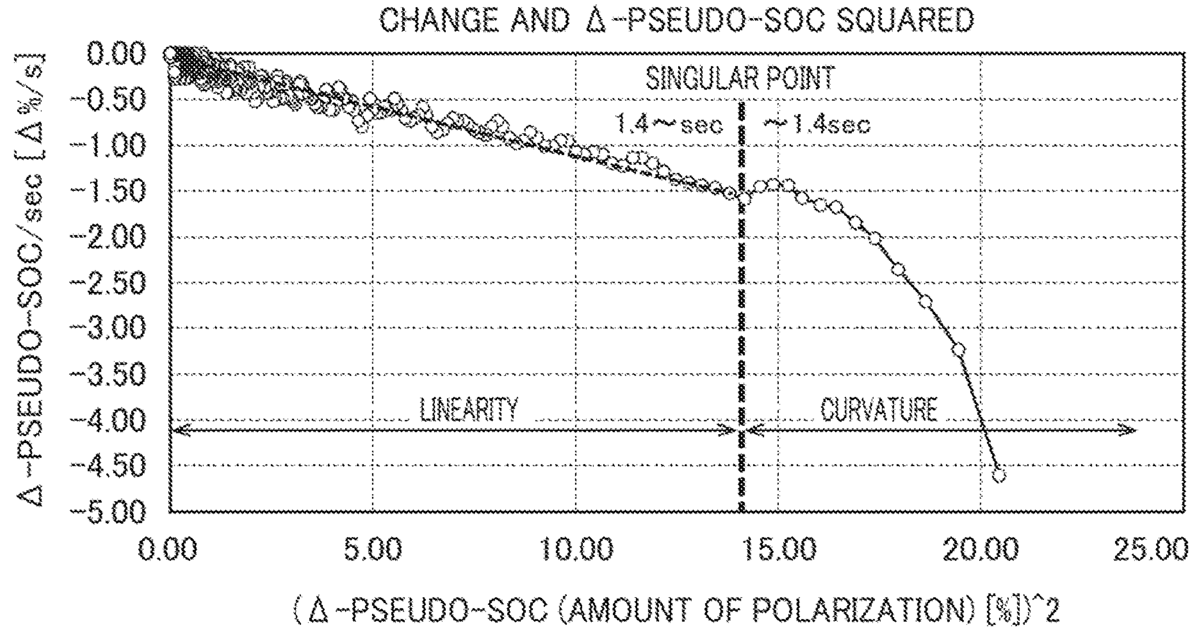
FIG. 12 is a view that illustrates a correlation between Δ-pseudo-SOC rate of change and the square of Δ-pseudo-SOC at a low temperature.

Note that FIG. 11 is a view that illustrates change in the Δ-pseudo-SOC value at low temperatures. In addition, FIG. 12 is a view that illustrates a correlation between Δ-pseudo-SOC rate of change and the square of Δ-pseudo-SOC at low temperatures. The example described above is data under a temperature of 25 degrees, whereas the example in FIG. 11 and FIG. 12 is data at a temperature of −10 degrees. As is clear from FIG. 11 and FIG. 12, regarding the correlation between the Δ-pseudo-SOC rate of change and the square of Δ-pseudo-SOC, the quantitative correlation (gradient of the regression line) changes due to the difference in temperature, but does not cease due to the difference in temperature.

Figures 13, 14:
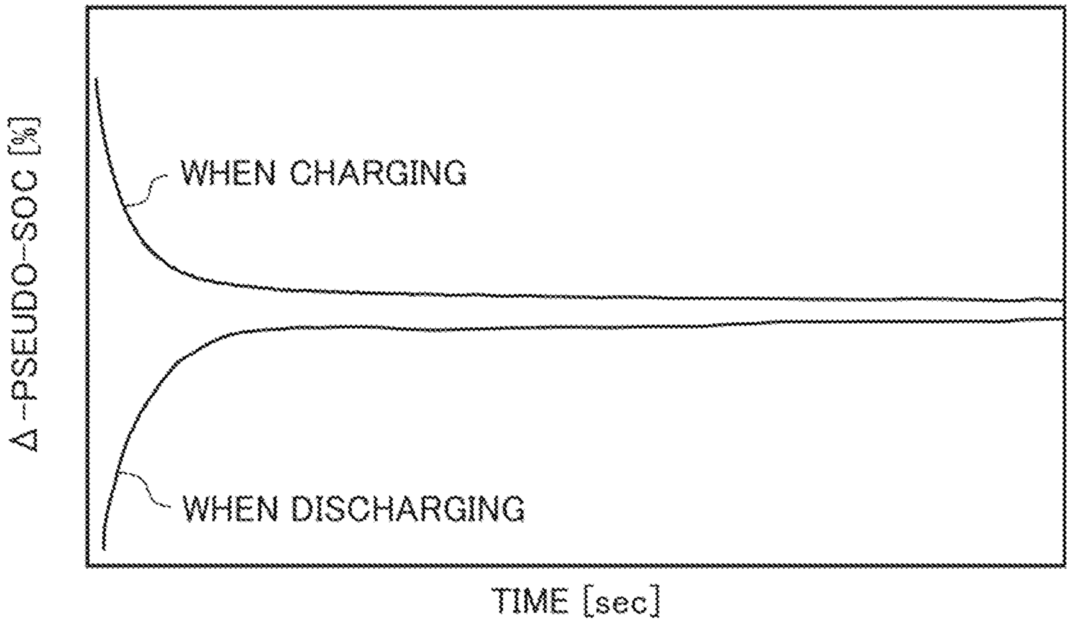
FIG. 13 is a view that illustrates change in Δ-pseudo-SOC at a time of charging and a time of discharging.
FIG. 14 is a view that schematically illustrates a lithium-ion concentration distribution during depolarization of a lithium-ion secondary battery.

In addition, description was given above by taking as an example a case where the battery 11 is continuously charged and then charging is stopped, but it can be said that the case for discharging is similar. Here, FIG. 13 is a view that illustrates change in Δ-pseudo-SOC at a time of charging and a time of discharging. As illustrated in FIG. 13, change in pseudo-SOC and Δ-pseudo-SOC, which are obtained based on CCV after the battery 11 continuously discharges and the discharging stops, differs in comparison to a time of charging only in that the curve is inverted in the Y axis direction as described above. In other words, in a case of discharging, change in pseudo-SOC values and Δ-pseudo-SOC values is a curve that goes from negative in the Y axis direction towards zero. Accordingly, a correlation of linearity is similarly found between the Δ-pseudo-SOC rate of change and the square of Δ-pseudo-SOC and, in the case of the same battery 11, having a singular point is common irrespective of being at a time of charging or a time of discharging, and the ranges of the first region and second region described above are also similar.

Returning to FIG. 2, the estimated SOC correction unit 109 executes an estimated SOC correction process in an estimated SOC correction step. Specifically, the estimated SOC correction unit 109 uses the regression line obtained by the regression line obtainment unit 108 to correct the estimated SOC value and make the estimated SOC value approach the post-depolarization true SOC to thereby estimate the post-depolarization SOC of the battery 11. The estimated SOC correction unit 109 estimates SOC by repeatedly correcting the estimated post-depolarization SOC a predetermined number of times, such that the Y-intercept b of the regression line matches the 0 point. Detail of this estimation of SOC is described in detail at a later stage.

Note that, because the control apparatus 10 in which the state-of-charge estimation apparatus 100 is provided is shut down, the estimated SOC correction unit 109 estimates post-depolarization SOC by correcting the estimated SOC value such that the estimated SOC value approach the post-depolarization true SOC.

The storage unit 110 executes a storage process in a storage step. Specifically, the storage unit 110 stores the first region for which linearity is not found and the second region for which linearity is found, for the correlation between the Δ-pseudo-SOC rate of change and the square of Δ-pseudo-SOC described above. Alternatively, configuration can be taken such the storage unit 110 measures and stores in advance the amount of time until the second region is entered, whereby the storage unit 110 starts processing after this amount of time has elapsed. In addition, the storage unit 110 stores an SOC-OCV curve that is for the battery 11 and has been obtained in advance.

The SOH calculation unit 111 executes an SOH calculation process in an SOH calculation step. Specifically, the SOH calculation unit 111 calculates a current battery capacity Ah (refer to the following equation (1)) by dividing, by an amount of change ΔSOC that is the amount by which the estimated SOC value corrected in the estimated SOC correction step changed due to continuous discharging or charging, a total accumulated value for current flowing while an estimated SOC value changed (in other words, change in battery capacity ΔAh). In addition, the SOH calculation unit 111 divides the calculated current battery capacity Ah by an initial battery capacity Ah to thereby calculate SOH, which is a degree of deterioration of the battery 11 (refer to the following equation (2)).

[Equation 1]

$$\text{CURRENT BATTERY CAPACITY Ah} = \Delta\text{Ah}/\Delta SOC \quad \text{Equation (1)}$$

[Equation 2]

$$SOH(\%) = (\text{CURRENT BATTERY CAPACITY Ah/INITIAL BATTERY CAPACITY Ah}) \times 100 \quad \text{Equation (2)}$$

The communication unit 112 receives charging information for the battery 11 from the management server 2 or the smart device 3, and transmits the charging information to the control apparatus 10 in the vehicle V. In addition, the communication unit 112 transmits various items of information, which pertain to the battery 11 and are obtained by the control apparatus 10, to the management server 2 or the smart device 3. For example, before the control apparatus 10 in which the state-of-charge estimation apparatus 100 is provided is shut down, the communication unit 112 transmits, to the external management server 2 or the smart device 3, the SOC estimated by the estimated SOC correction unit 109 or the SOH calculated by the SOH calculation unit 111.

Next, description is given regarding estimation of SOC by the estimated SOC correction unit 109. FIG. 14 is a view that schematically illustrates a lithium-ion concentration distribution during depolarization of a lithium-ion secondary battery. As illustrated in FIG. 14, there is deviation in the lithium-ion concentration near a current collector in the battery, which is undergoing depolarization. The lithium-ion concentration near the current collector is high, and this represents pseudo-SOC before depolarization. In addition, the difference between a pseudo-SOC value and a true SOC value represents an amount of polarization.

As described above, the pseudo-SOC rate of change (d(pseudo-SOC)/dt) has a second-order correlation with the amount of polarization, which is the difference between a pseudo-SOC value and a true SOC value (pseudo-SOC—true SOC). Letting a pseudo-SOC rate-of-change coefficient be a (gradient), the following equation (3) is established.

$$y = \frac{d\,\text{PSEUDO} - SOC}{dt} = a * (\text{PSEUDO} - SOC - \text{TRUE } SOC)^2 \quad \text{[Equation 3]}$$

Due to Fick's first law, it is known that there is a first-order correlation between ion concentration deviation (d(concentration)/dx) and an ion diffusion rate. Accordingly, it is considered that the pseudo-SOC rate of change (d(pseudo-SOC)/dt), in other words the depolarization rate, is impacted by the amount of polarization which is the difference between a pseudo-SOC value and a true SOC value, arising due to the deviation in lithium-ion concentration. As a result, the depolarization rate (pseudo-SOC rate of decline) can be said to have a correlation with the difference between a pseudo-SOC value and a true SOC value.

In addition, a result of adding an error to a true SOC value corresponds to an estimated SOC value. Therefore, the following equation (4) is derived from the abovementioned equation (3). The b in the following equation (4) represents a Y-intercept, and it is understood that SOC estimation error is represented by deviation in the Y-intercept position.

$$y = \frac{d\,\text{PSEUDO} - SOC}{dt} = a * (\text{PSEUDO} - SOC - (\text{TRUE } SOC + \text{ERROR}))^2 + b \quad \text{[Equation 4]}$$

Figure 15:
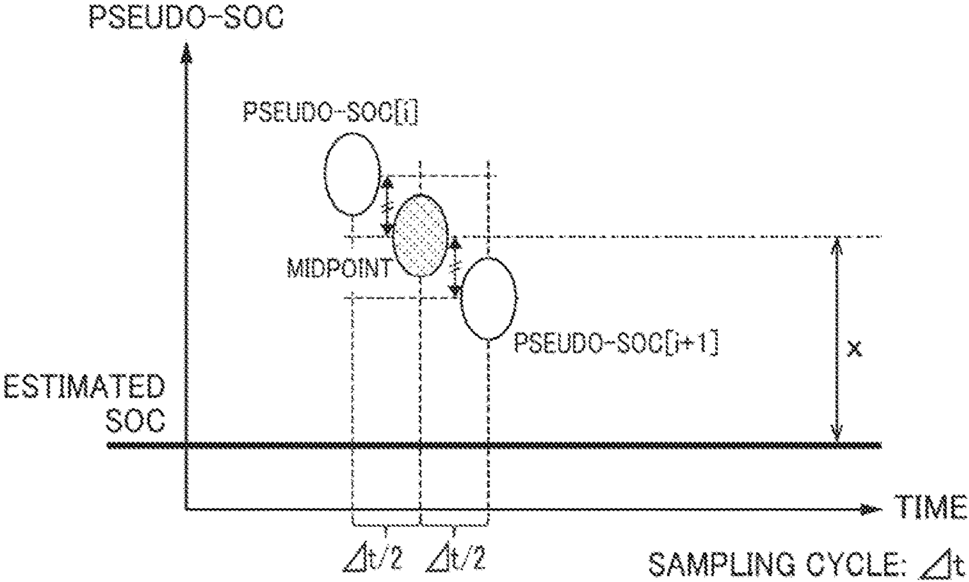
FIG. 15 is a view for describing a linear regression computation.

Here, with reference to FIG. 15, description is given regarding a linear regression computation according to the present embodiment. FIG. 15 is a view for describing a linear regression computation. In FIG. 15, the horizontal axis represents time, and the vertical axis represents a pseudo-SOC value. FIG. 15 illustrates pseudo-SOC[i] and pseudo-SOC[i+1] which are obtained at a sampling cycle Δt. In the linear regression computation according to the present embodiment, data for 0 to n is used to respectively obtain Y which is the gradient between data points, and X is the midpoint between data points. Accordingly, the number of Y and X can be achieved is that for i=0 to n−1. Accordingly, in the linear regression computation according to the present embodiment, the obtained pseudo-SOC[0] through pseudo-SOC[n] and the estimated SOC value are used to create arrays for X[0 to n−1] and Y[0 through n−1] from the abovementioned equation (4), and the created arrays are used to calculate the gradient a and the Y-intercept b.

Figure 16:
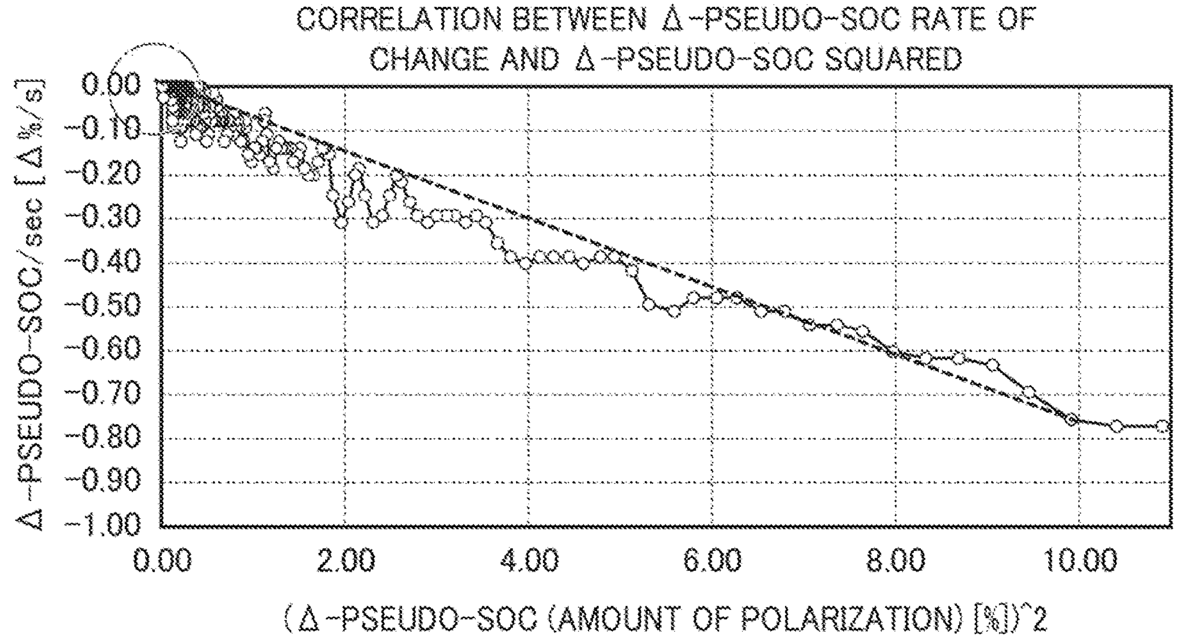
FIG. 16 is a view that illustrates a correlation between Δ-pseudo-SOC rate of change and the square of Δ-pseudo-SOC, and is a view that illustrates an example when the Y-intercept of a regression line is on the 0 point.
Figure 17:
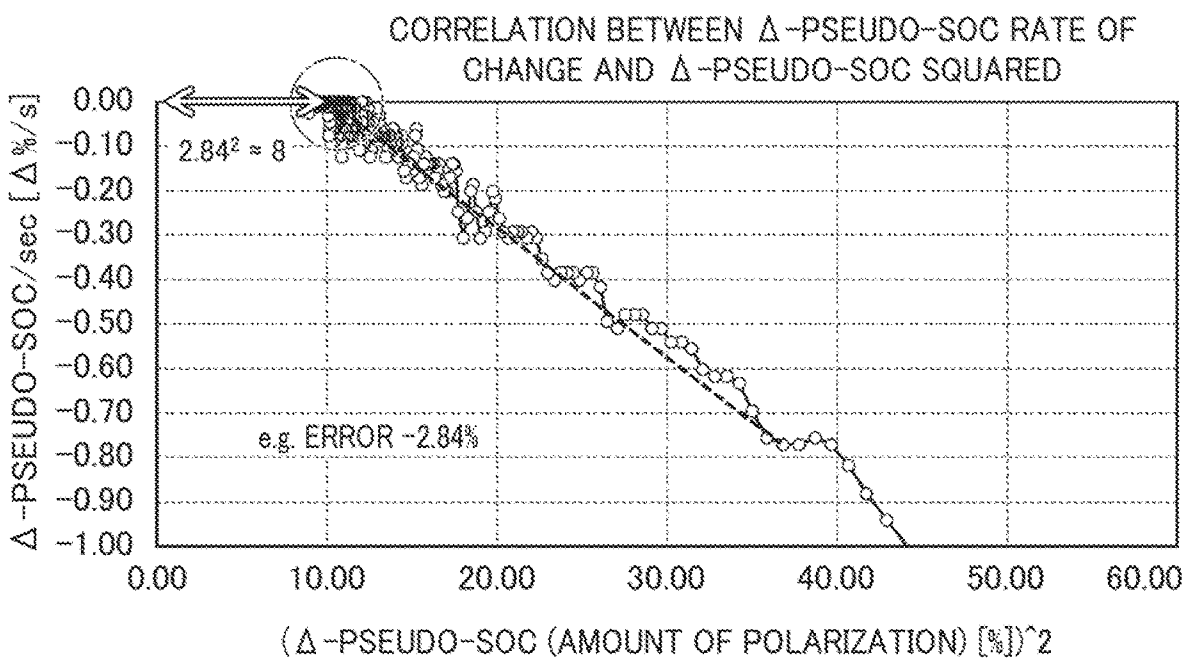
FIG. 17 is a view that illustrates a correlation between Δ-pseudo-SOC rate of change and the square of Δ-pseudo-SOC, and is a view that illustrates an example when the Y-intercept of a regression line has deviated onto the positive side.
Figure 18:
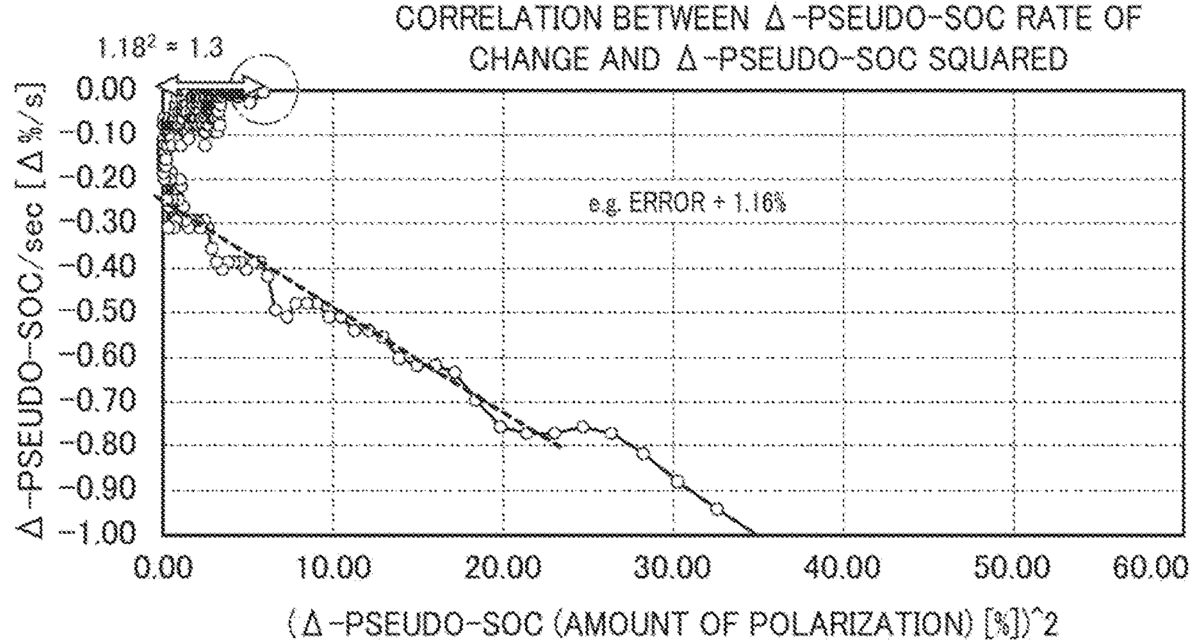
FIG. 18 is a view that illustrates a correlation between Δ-pseudo-SOC rate of change and the square of Δ-pseudo-SOC, and is a view that illustrates an example when the Y-intercept of a regression line has deviated onto the negative side.

Examples of regression lines obtained in the above manner are illustrated in FIG. 16 through FIG. 18. FIG. 16 is a view that illustrates a correlation between a Δ-pseudo-SOC rate of change and the square of Δ-pseudo-SOC, and is a view that illustrates an example when the Y-intercept of a regression line is on the 0 point. In other words, the Y-intercept b representing SOC estimation error is 0, and is a case where the estimated SOC value is the true SOC value without error.

In contrast to this, FIG. 17 is a view that illustrates a correlation between a Δ-pseudo-SOC rate of change and the square of Δ-pseudo-SOC, and is a view that illustrates an example when the Y-intercept of a regression line has deviated onto the positive side. FIG. 18 is a view that illustrates a correlation between a Δ-pseudo-SOC rate of change and the square of Δ-pseudo-SOC, and is a view that illustrates an example when the Y-intercept of a regression line has deviated onto the negative side. In FIG. 17 and FIG. 18, the Y-intercept b, which represents SOC estimation error, is not at 0, and it is understood that each estimated SOC value includes error.

Accordingly, it is possible to repeatedly correct SOC estimated values such that the Y-intercept b for the regression line matches the 0 point, to thereby cause the SOC estimated values to gradually approach true SOC values. Therefore, the estimated SOC correction unit 109 according to the present embodiment obtains estimated SOC values by repeatedly correcting the estimated post-depolarization SOC a predetermined number of times, such that the Y-intercept b of the regression line matches the 0 point, and thus is capable of estimating a more accurate SOC.

Figure 19:
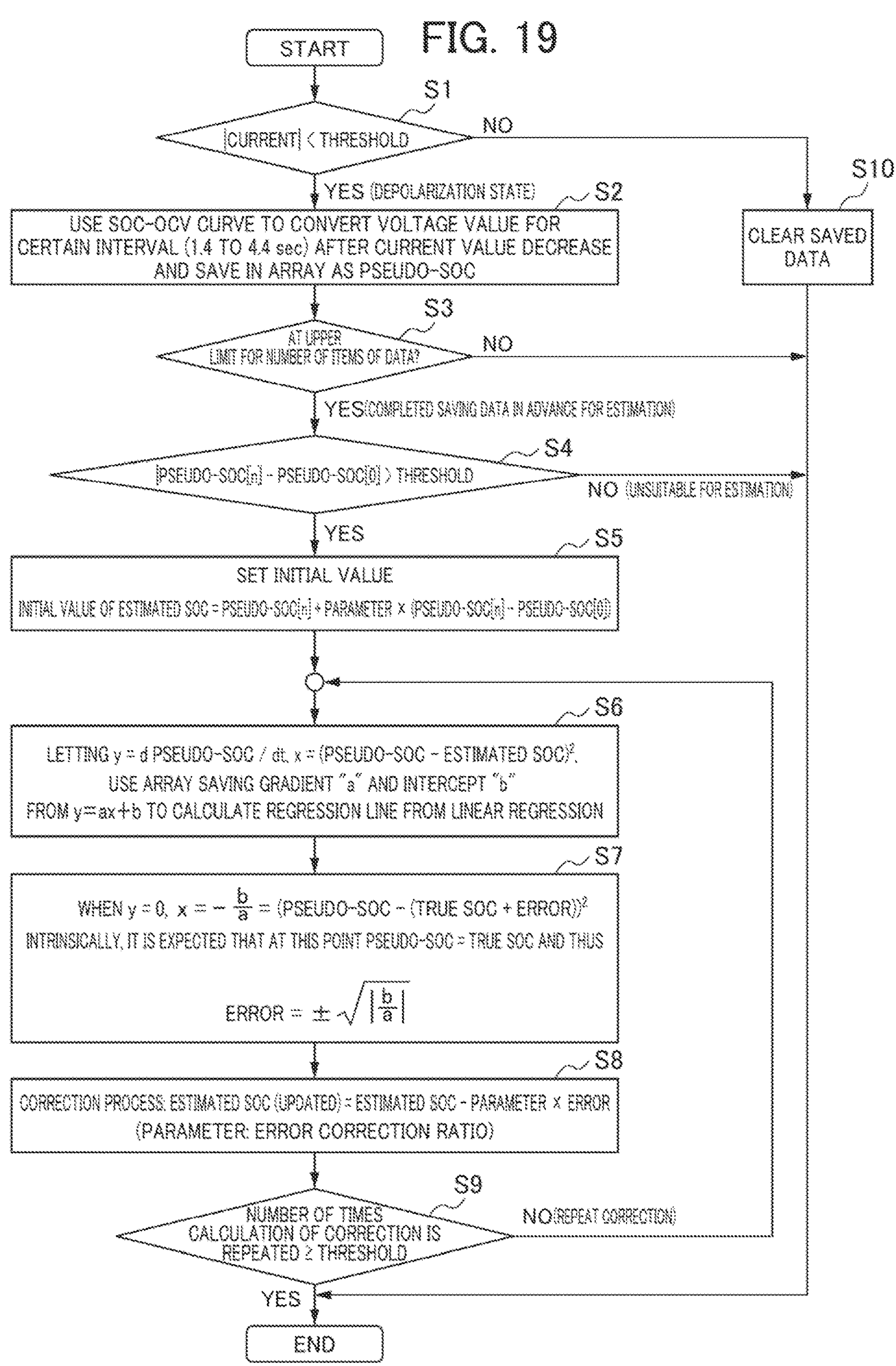
FIG. 19 is a flow chart that illustrates a specific procedure for an SOC estimation process according to one embodiment of the present invention.

Next, with reference to FIG. 19 through FIG. 21, description is given in detail regarding a specific procedure for an SOC estimation process by the state-of-charge estimation apparatus 100 according to the present embodiment.

FIG. 19 is a flow chart that illustrates a specific procedure for an SOC estimation process according to the present embodiment. This SOC estimation process is repeatedly executed each time the battery 11 is continuously charged or discharged.

In Step S1, for example the vehicle V stops, and before entering a shutdown sequence for the control apparatus 10, it is determined whether a current value flowing to the battery 11 is less than a predetermined threshold. If this determination is YES, the process advances to Step S2, if NO, the process advances to Step S10, saved data (such as a voltage value) is cleared, and this process ends.

In Step S2, a state has been entered in which depolarization is underway and the current value is less than the predetermined threshold, and thus a voltage value for a certain interval (for example, 1.4 to 4.4 seconds) after the current value has decreased is converted using an SOC-OCV curve to thereby obtain n pseudo-SOC values, and these n pseudo-SOC values are saved in an array, in accordance with obtainment order. In other words, a voltage value is not obtained until the certain interval (for example, 1.4 seconds) has elapsed from when depolarization starts and, after the certain interval has elapsed, the voltage value and pseudo-SOC value are obtained only for a predetermined amount of time (for example, 3 seconds), while confirming that the current value is less than the abovementioned threshold. Subsequently, the process advances to Step S3.

In Step S3, it is determined whether the number of items of data for the obtained pseudo-SOC value has reached an upper limit. The upper limit for the number of items of data is set to a number necessary for accurate SOC estimation, the number resulting from, inter alia, an experiment performed in advance. If this determination is YES, the process advances to Step S4. If this determination is NO, there is a shortage in the required number of items of data, accurate SOC estimation is not possible, and thus this process ends.

In Step S4, obtainment and saving of data in advance for SOC estimation is complete. Therefore, it is determined whether the absolute value of the difference between the nth obtained pseudo-SOC value and the pseudo-SOC value obtained first is greater than a predetermined threshold. In a case where this determination is YES, the process advances to Step S5. In a case of NO, there is insufficient depolarization, and thus this process ends because this depolarization is unsuitable for SOC estimation.

In Step S5, an initial value for estimated SOC is set. Specifically, in accordance with the following equation (5), the initial value for estimated SOC is set to a value resulting from adding the nth obtained pseudo-SOC value to a value resulting from multiplying a parameter by the difference between the nth obtained pseudo-SOC value and the first obtained pseudo-SOC value. With reference to, inter alia, later-described FIG. 21, the parameter is set in consideration of a depolarization direction, and is set to 5, for example. The position of estimated SOC values and true SOC values are adjusted by the setting of this parameter, and it is possible to have adjustment to a position where correction is easier, from among regression lines illustrated in FIG. 20 and FIG. 21, which are described below. Subsequently, the process advances to Step S6.

[Equation 5]

$$\text{INITIAL VALUE FOR ESTIMATED } SOC = \text{PSEUDO} - SOC[n] + \text{PARAMETER} \times (\text{PSEUDO} - SOC[n] - (\text{PSEUDO} - SOC[0])) \quad \text{Equation (5)}$$

In Step S6, a regression line is calculated. Specifically, letting Y=d(pseudo-SOC)/dt and X=(pseudo-SOC−estimated SOC)$^2$, pseudo-SOC value array data in which the gradient a and the Y-intercept b for Y=aX+b is saved is used to calculate the regression line in accordance with a linear regression computation such as least squares. Subsequently, the process advances to Step S7.

In Step S7, estimated SOC error, in other words an amount of correction, is calculated. Specifically, when Y=0, X=−b/a=(pseudo-SOC−(true SOC+error))$^2$ and it is intrinsically expected that pseudo-SOC=true SOC at this time. Therefore, error represented by the following equation (6) is calculated as the error (amount of correction). Subsequently, the process advances to Step S8.

$$\text{ERROR} = \pm\sqrt{\left|\frac{b}{a}\right|} \quad \text{[Equation 6]}$$

In Step S8, an estimated SOC correction process is executed. Specifically, in accordance with the following equation (7), estimated SOC is corrected and updated. Note that the parameter, which is an error correction ratio, is set to 0.5, for example. As a result, it is possible to cause estimated SOC to gradually approach true SOC. Subsequently, the process advances to Step S9.

[Equation 7]

$$\text{ESTIMATED } SOC \text{ (UPDATED)} = \text{ESTIMATED } SOC - \text{PARAMETER} \times \text{ERROR (AMOUNT OF CORRECTION)} \quad \text{Equation (7)}$$

Here, FIG. 20 is a view that illustrates various regression lines calculated in Step S6. In addition, FIG. 21 is a view that illustrates a relationship between an amount of correction (error), and a gradient a, a Y-intercept b, and an X-intercept (−b/a) of regression lines. As illustrated in FIG. 20 and FIG. 21, the regression lines are divided into several patterns in accordance with respective values for the gradient a, the Y-intercept b, and the X-intercept (−b/a). A determination of the sign (positive or negative) for the amount of correction (error) is made with reference to relationships in FIG. 21. In a case where each of the gradient a and the X-intercept (−b/a) are positive and negative, the regression line illustrated in FIG. 20 curves and correction becomes difficult. Therefore, in a case of discharging, it is desirable to adjust the initial value for estimated SOC by adjusting the above-described parameter in order to achieve a pattern where the gradient a is positive and the X-intercept (−b/a) is also positive. In a case of charging, it is desirable to adjust the initial value for estimated SOC by adjusting the above-described parameter in order to achieve a pattern where the gradient a is negative and the X-intercept (−b/a) is positive.

In Step S9, it is determined whether a number of repeated correction calculations is greater than or equal to a predetermined threshold. The predetermined threshold is not limited in particular, but is set to 5 times, for example. If this determination is YES, this process ends. If NO, the process returns to Step S6 and execution of the correction process is repeated.

By virtue of the state-of-charge estimation apparatus 100 according to the present embodiment, the following effects are achieved.

By virtue of the present embodiment, cell voltage data for after continuous charging or discharging with respect to the battery 11 is complete is used to obtain a regression line representing the rate of change of Δ-pseudo-SOC values with respect to the square of the Δ-pseudo-SOC values before depolarization, and this regression line is used to estimate post-depolarization SOC for the battery 11. Therefore, for example, it is possible to accurately estimate SOC even before depolarization of the battery 11 immediately before shut down. Accordingly, in particular, regarding a vehicle V to which usage such as V2G or V2H is applied, it is possible to ensure sufficient computation frequency and computation accuracy, and it is possible to improve the accuracy of estimating SOC for the battery 11. In addition, for example, it is possible to perform a calculation before the vehicle V shuts down even in a case where the amount of depolarization time after continuous charging or discharging is long. Therefore, it is possible to increase the frequency of estimating SOC, and it is possible to promptly notify a user of the latest SOC.

In addition, by virtue of the present embodiment, it is possible to reduce the number of times voltage, current, and pseudo-SOC values are obtained, and it is possible to reduce load on the control apparatus 10 because pseudo-SOC values as well as voltage or current are not obtained in the first region in which there is non-linearity in the correlation between the rate of change of Δ-pseudo-SOC values and the square of Δ-pseudo-SOC values, and pseudo-SOC values as well as voltage or current are only obtained in the second region in which there is linearity.

In addition, by virtue of the present embodiment, post-depolarization SOC is estimated before a shutdown sequence for the control apparatus 10 installed in the vehicle V, and thus it is possible to promptly obtain and ascertain the latest SOC in a state where charging or discharging has completed.

In addition, by virtue of the present embodiment, obtaining pseudo-SOC values is limited to within a predetermined amount of time, and thus it is possible to promptly obtain and ascertain the latest SOC in a state where charging or discharging has completed, while avoiding delaying a shutdown process.

In addition, by virtue of the present embodiment, it is possible to employ CCV after charging or discharging has stopped as OCV, and obtain, from an SOC-OCV curve, a pseudo-SOC value before depolarization, and the effects described above are reliably achieved.

In addition, by virtue of the present embodiment, an SOH calculation unit is provided, whereby it is possible to accurately calculate SOH in addition to SOC before depolarization of the battery 11.

In addition, by virtue of the present embodiment, before shutdown, it is possible to transmit an accurately calculated SOH to the external management server 2, a diagnosis instrument, or user infotainment such as the smart device 3, which is a smartphone or the like.

In addition, by virtue of the present embodiment, post-depolarization SOC is estimated by using a linear relationship between the rate of change of Δ-pseudo-SOC values and the square of the Δ-pseudo-SOC values, and thus it is possible to estimate an accurate post-depolarization SOC in a short amount of time.

In addition, by virtue of the present embodiment, it is possible to estimate a true SOC in a short amount of time because a regression line representing the rate of change of a Δ-pseudo-SOC value with respect to the square of the Δ-pseudo-SOC value before depolarization is corrected and caused to undergo a translation such that a Y-intercept b of the regression line matches a 0 point, whereby the estimated SOC gradually approaches the true SOC.

Note that the present invention is not limited to the embodiment described above, and the present invention includes modifications and improvements within a range that enables the object of the present invention to be achieved.

EXPLANATION OF REFERENCE NUMERALS

1 Power storage system
10 Control apparatus
100 State-of-charge estimation apparatus
101 Charge/discharge control unit
102 Voltage and current obtainment unit
103 Shutdown processing unit
104 Pseudo-SOC obtainment unit
105 Estimated SOC provisional setting unit
106 Δ-pseudo-SOC obtainment unit
107 Correlation obtainment unit
108 Regression line obtainment unit
109 SOC estimation unit
110 Storage unit
111 SOH calculation unit
112 Communication unit
11 Battery
12 Sensor
121 Voltage sensor
122 Current sensor
2 Management server
21 Storage unit
22 Control unit
23 Communication unit
3 Smart device
31 Operation unit 32 Display unit 33 Communication unit V Vehicle (mobile body)

What is claimed is:

1. A state-of-charge estimation method for estimating an SOC that is a state of charge of a battery, the method comprising:

obtaining a plurality of pseudo-SOC values before depolarization of the battery, based on a voltage of the battery after the battery is continuously charged or discharged and the charging or discharging is stopped;

setting an initial value for an estimated SOC value that is estimated as a post-depolarization SOC;

obtaining a Δ-pseudo-SOC value that is a difference between each of the pseudo-SOC values and the estimated SOC value;

obtaining plot data indicating a correlation between a square of the Δ-pseudo-SOC value obtained and a rate of change of the Δ-pseudo-SOC value;

classifying the plot data obtained into a first region in which the rate of change of the Δ-pseudo-SOC value changes non-linearly with respect to the square of the Δ-pseudo-SOC value and a second region in which the rate of change of the Δ-pseudo-SOC value changes linearly with respect to the square of the Δ-pseudo-SOC value, and obtaining a regression line representing the rate of change of the Δ-pseudo-SOC value with respect to the square of the Δ-pseudo-SOC value when the rate of change of the Δ-pseudo-SOC value is in the second region;

using the regression line obtained to correct the estimated SOC value such that the estimated SOC value approaches a post-depolarization true SOC value; and controlling charging and discharging of the battery based on the corrected estimated SOC value.

2. The state-of-charge estimation method according to claim 1, further comprising:

storing the first region and the second region from the plot data, wherein, in obtaining the plurality of pseudo-SOC values, the pseudo-SOC values are not obtained within an amount of time corresponding to the first region that is stored in advance in storing the first region and the second region, and the pseudo-SOC values are only obtained within an amount of time corresponding to the second region that is stored in advance in storing the first region and the second region.

3. The state-of-charge estimation method according to claim 1, wherein the battery is installed in a vehicle, and in using the regression line obtained to correct the estimated SOC value, the estimated SOC value is corrected and the estimated SOC value approaches a post-depolarization true SOC value before a controller installed in the vehicle shuts down.

4. The state-of-charge estimation method according to claim 1, wherein, in obtaining the plurality of pseudo-SOC values before depolarization of the battery, obtaining the pseudo-SOC values is limited to within a predetermined amount of time.

5. The state-of-charge estimation method according to claim 1, wherein, in obtaining the plurality of pseudo-SOC values before depolarization of the battery, the voltage of the battery when a current flowing to the battery is less than a predetermined value after the battery is continuously charged or discharged and the charging or discharging is stopped is employed as an OCV, and the pseudo-SOC values are obtained from an SOC-OCV curve prepared in advance for the battery.

6. The state-of-charge estimation method according to claim 1, further comprising: calculating a current battery capacity Ah by dividing, by an amount of change ΔSOC that is an amount by which the estimated SOC value, corrected in using the regression line obtained to correct the estimated SOC value, changed due to continuous discharging or charging, a total accumulated value for a current that flowed while the estimated SOC value changed, and calculating an SOH that is a degree of deterioration of the battery, by dividing the calculated current battery capacity Ah by an initial battery capacity Ah.

7. The state-of-charge estimation method according to claim 6, further comprising: externally transmitting the SOH calculated in calculating the current battery capacity Ah and calculating the SOH, before a controller installed in a vehicle shuts down.

8. The state-of-charge estimation method according to claim 1, wherein, letting the rate of change of the Δ-pseudo-SOC value be a Y axis and the square of the Δ-pseudo-SOC value be an X axis, the regression line is obtained, in classifying the correlation obtained and obtaining the regression line, by calculating a gradient a and a Y-intercept b using a linear regression computation.

9. The state-of-charge estimation method according to claim 8, wherein the estimated SOC value approaches the post-depolarization true SOC value by repeatedly correcting the estimated SOC value a predetermined number of times such that the Y-intercept b for the regression line matches a 0 point, in using the regression line obtained to correct the estimated SOC value.

* * * * *